United States Patent
Dakshina-Murthy et al.

(10) Patent No.: US 7,386,162 B1
(45) Date of Patent: *Jun. 10, 2008

(54) POST FABRICATION CD MODIFICATION ON IMPRINT LITHOGRAPHY MASK

(75) Inventors: Srikanteswara Dakshina-Murthy, Wappingers Falls, NY (US); Bhanwar Singh, Morgan Hill, CA (US); Ramkumar Subramanian, Sunnyvale, CA (US)

(73) Assignee: Advanced Micro Devices, Inc, Austin, TX (US)

( * ) Notice: Subject to any disclaimer, the term of this patent is extended or adjusted under 35 U.S.C. 154(b) by 729 days.

This patent is subject to a terminal disclaimer.

(21) Appl. No.: 10/874,498

(22) Filed: Jun. 23, 2004

(51) Int. Cl.
*G06K 9/00* (2006.01)

(52) U.S. Cl. .................... 382/144; 430/313; 438/705; 716/19

(58) Field of Classification Search .............. 382/144; 430/5, 322, 324, 22, 311, 295, 296, 30, 312, 430/313, 394, 316, 330; 438/689, 780, 963, 438/291, 305, 705; 250/492.1, 310, 492.22, 250/398; 216/26, 66, 24; 355/67, 53; 716/19–21
See application file for complete search history.

(56) References Cited

U.S. PATENT DOCUMENTS

| | | | | |
|---|---|---|---|---|
| 4,546,535 | A * | 10/1985 | Shepard | 438/304 |
| 5,246,782 | A * | 9/1993 | Kennedy et al. | 428/421 |
| 6,030,732 | A * | 2/2000 | Liu | 430/30 |
| 6,514,778 | B2 * | 2/2003 | Huang et al. | 438/17 |
| 7,159,205 | B1 * | 1/2007 | Amblard et al. | 716/19 |

* cited by examiner

*Primary Examiner*—Sheela Chawan
(74) *Attorney, Agent, or Firm*—Amin, Turocy & Calvin, LLP

(57) ABSTRACT

The present invention relates generally to photolithographic systems and methods, and more particularly to systems and methodologies that facilitate compensating for imprint mask critical dimension error(s). An aspect of the invention generates feedback information that facilitates control of imprint mask critical dimension via employing a scatterometry system to detect imprint mask critical dimension error, and mitigating the error via a spacer etchback procedure.

18 Claims, 10 Drawing Sheets

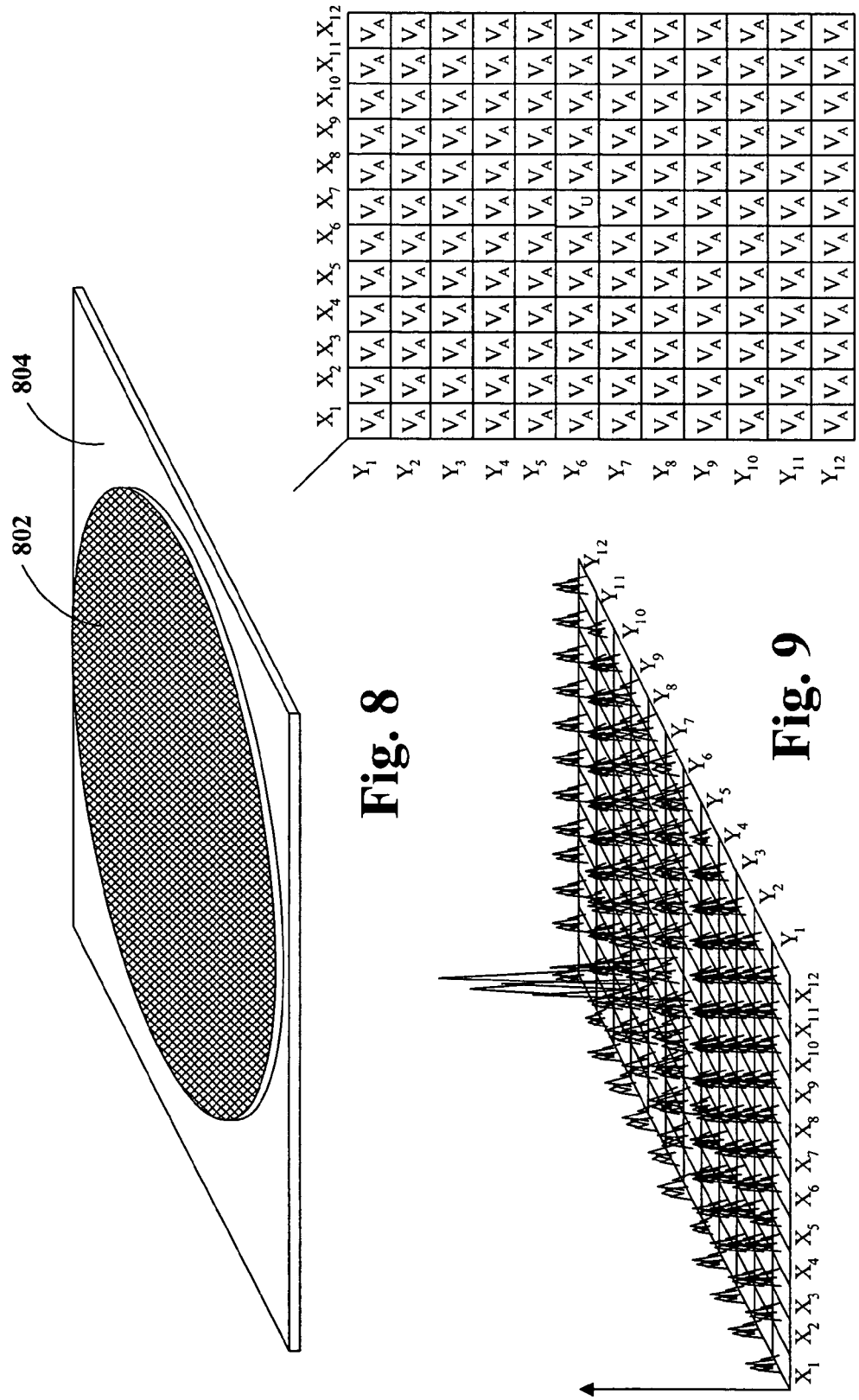

POST FABRICATION CD MODIFICATION ON IMPRINT LITHOGRAPHY MASK

TECHNICAL FIELD

The present invention relates generally to photolithographic systems and methods, and more particularly to systems and methodologies that modify post imprint mask fabrication critical dimension (CD).

BACKGROUND OF THE INVENTION

As semiconductor trends continue toward decreased size and increased packaging density, every aspect of semiconductor fabrication processes is scrutinized in an attempt to maximize efficiency in semiconductor fabrication and throughput. Many factors contribute to fabrication of a semiconductor. For example, at least one photolithographic process can be used during fabrication of a semiconductor. This particular factor in the fabrication process is highly scrutinized by the semiconductor industry in order to improve packaging density and precision in semiconductor structure.

Lithography is a process in semiconductor fabrication that generally relates to transfer of patterns between media. More specifically, lithography refers to transfer of patterns onto a thin film that has been deposited onto a substrate. The transferred patterns then act as a blueprint for desired circuit components. Typically, various patterns are transferred to a photoresist (e.g., radiation-sensitive film), which is the thin film that overlies the substrate during an imaging process described as "exposure" of the photoresist layer. During exposure, the photoresist is subjected to an illumination source (e.g. UV-light, electron beam, X-ray), which passes through a pattern template, or reticle, to print the desired pattern in the photoresist. Upon exposure to the illumination source, radiation-sensitive qualities of the photoresist permit a chemical transformation in exposed areas of the photoresist, which in turn alters the solubility of the photoresist in exposed areas relative to that of unexposed areas. When a particular solvent developer is applied, exposed areas of the photoresist are dissolved and removed, resulting in a three-dimensional pattern in the photoresist layer. This pattern is at least a portion of the semiconductor device that contributes to final function and structure of the device, or wafer.

Current methods of pattern line formation on a photolithography mask typically produce LER as an undesirable side effect which can increase mask fabrication cost. As lithographic techniques are pushed to their limits, smaller and smaller CDs are desired to maximize chip performance. Thus, chip manufacture is governed largely by wafer CD, which is defined as the smallest allowable width of, or space between, lines of circuitry in a semiconductor device. As methods of wafer manufacture are improved, wafer CD is decreased, which in turn requires finer and finer line edges to be produced, which further requires finer and finer mask features.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for systems and methods that mitigate the post fabrication defects formed on an imprint mask. More specifically, the systems and methods of the invention can mitigate imprint mask critical dimension error(s) in order to improve imprint mask performance and ultimately chip performance. That is, the mitigation of CD errors on post fabrication masks minimizes mask production costs and ultimately improves chip performance.

According to an aspect of the invention, an imprint mask can be monitored to detect the presence of critical dimension error. A monitor component, such as, for example, a scatterometry system, can provide real-time information regarding the status of features on the imprint mask. If critical dimension error is detected, a modification component can selectively deposit a spacer oxide on the mask and then etch the oxide layer to compensate for the error. Furthermore, the modification component can make determinations regarding whether imprint wafer critical dimension error(s) are present, whether extant errors are potentially detrimental to a wafer, whether compensatory action was successful in mitigating detected critical dimension error, etc., based on information received from the monitor component.

According to another aspect of the invention, inferences can be made regarding, for example, whether to initiate compensatory action to correct detected imprint mask critical dimension error. Such inferences can be based on, for example, information related to the severity of the critical dimension error, the percentage of error (e.g., based upon the achieved gap distance between features and the target gap distance), the location of detected critical dimension error, etc. This aspect of the invention permits greater efficiency and economic benefit by augmenting the criteria germane to making a decision regarding compensating for potentially destructive critical dimension error on an imprint mask.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to comprise all such aspects and their equivalents. Other advantages and novel features of the invention will become apparent from the following detailed description of the invention when considered in conjunction with the drawings.

BRIEF DESCRIPTION OF THE DRAWINGS

FIG. 8 illustrates a perspective view of a grid-mapped mask according to one or more aspects of the present invention.

FIG. 9 illustrates plots of measurements taken at grid-mapped locations on a mask in accordance with one or more aspects of the present invention.

FIG. 10 illustrates a table containing entries corresponding to measurements taken at respective grid-mapped locations on a mask in accordance with one or more aspects of the present invention.

DETAILED DESCRIPTION OF THE INVENTION

Figure 1:
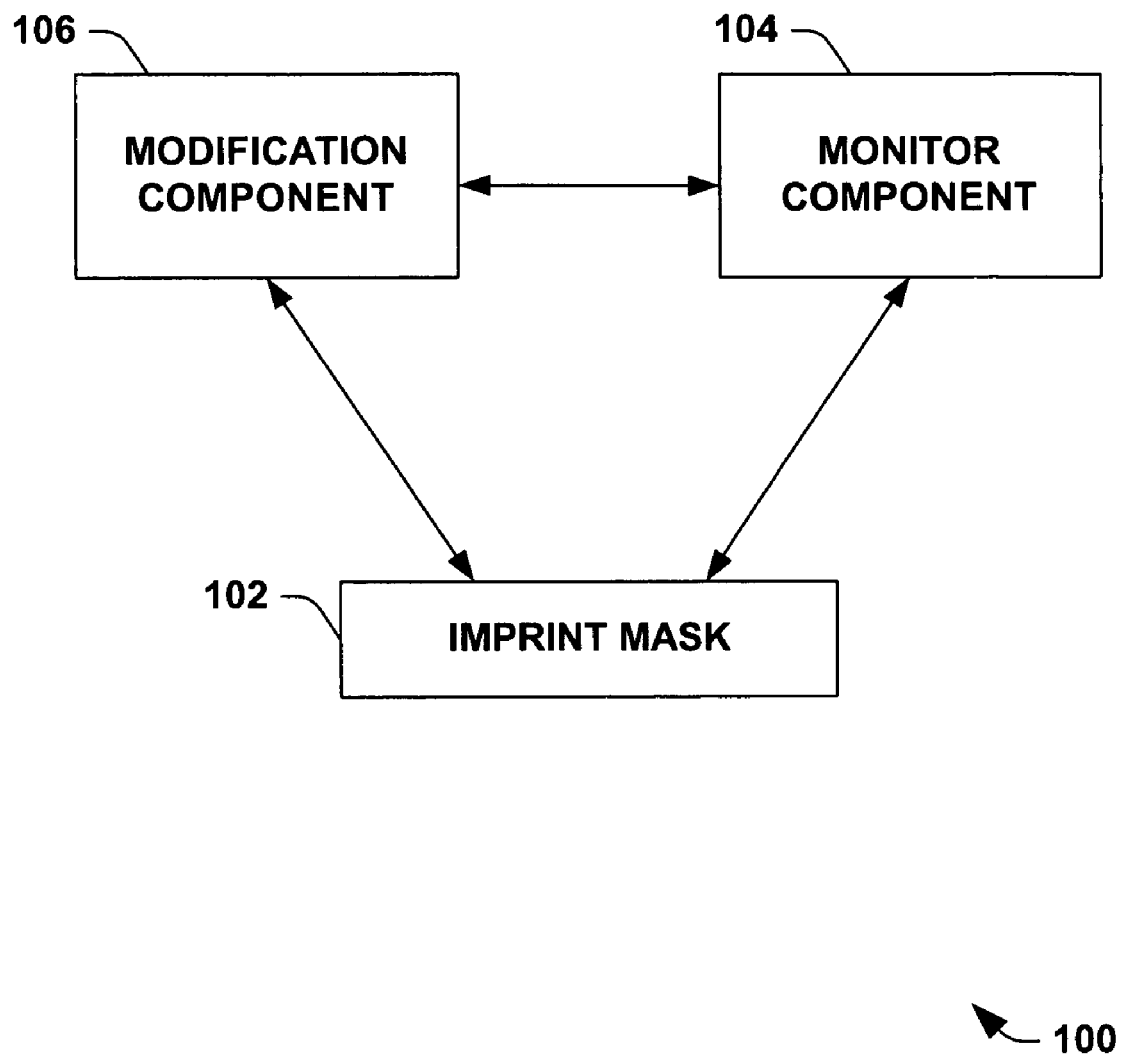
FIG. 1 is an illustration of a mask critical dimension modification system in accordance with an aspect of the present invention.

The present invention will now be described with reference to the drawings, wherein like reference numerals are used to refer to like elements throughout. The present invention will be described with reference to systems and methods for mitigating retrograde profiles on imprint mask features. It should be understood that the description of these exemplary aspects are merely illustrative and that they should not be taken in a limiting sense.

The term "component" refers to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

Imprint lithography uses a patterned mask to "imprint" a pattern on a resist at a 1:1 feature size ratio. Imprint masks are defined at 1× (e.g., using an e-beam direct write). The 1× definition is an extremely expensive process in which errors can be costly. Moreover, critical dimension (CD) errors cannot be compensated after a lithography imprint mask is fabricated. Thus, expensive imprint mask fabrication results due to repeat manufacturing attempts based upon CD errors. Furthermore, imprint mask integrity must be maintained throughout the lithography process because any flaw or structural defect present on a patterned imprint mask can be indelibly transferred to underlying layers during imprinting of a photoresist. One example of an undesirable structural defect is line-edge roughness (LER). LER refers to variations on sidewalls of features, which can result in variations of LER in the patterned photoresist and increased critical dimensions (CDs). Many factors can contribute to LER in the an imprint mask pattern, such as LER on chrome patterns residing on the reticle, image contrast in a system that generates the mask pattern, an etch process that can be used to pattern the mask, inherent properties and/or weaknesses of the mask materials, and/or the mask processing method. Additionally, LER appearing in fabricated structures can result from damage to the patterned resist during an etch process. Thus, imprint mask integrity is a crucial element that must be maintained throughout the lithography process.

Now referring to the figures, FIG. 1 illustrates a mask critical dimension modification system 100 in which critical dimension (CD) errors are mitigated in post fabrication imprint masks. For example, the imprint mask 102 can be, but not limited to, quartz. The imprint mask 102 coupled to the monitor component 104 provides the detection of CD errors during and/or after fabrication. For example, the monitor component 104 can monitor aspects and/or conditions associated with the imprint mask 102 during fabrication and/or prior to imprinting a wafer in order to glean information associated with potential defects and/or errors on the imprint mask 102. Such information can be relayed to the modification component 106 for analysis. If information gathered by the monitor component 104 is indicative of a mask defect, the modification component 106 can initiate compensatory action to mitigate the detrimental effect of such a defect on a wafer during imprinting of the wafer. Upon detection of a CD error from the monitor component 104, the modification component 106 provides the mitigation of post fabrication errors on the imprint mask 102. The modification component 106 mitigates CD errors by providing a deposition layer (e.g., silicon dioxide ($SiO_2$)) in which a spacer etch can be used to control the profile and lateral lines. By using a spacer etch to control the profile of the imprint mask 102, the gaps within the imprint mask 102 are smaller which ultimately leads to smaller line features when used in imprint lithography.

To further this example, if the monitor component 104 detects a condition indicative of a CD error on a imprint mask 102, then the modification component 106 can utilize spacer etchback to selectively deposit a layer of, for example, silicon dioxide ($SiO_2$), over the imprint mask 102 profile. The modification component 106 can then selectively etch the $SiO_2$ from the mask in a manner that permits $SiO_2$ to remain in the feature gaps as required to correct errors. Thus, the imprint mask can be repaired to improve integrity and mitigate fabrication costs of imprint masks.

The invention is not limited to SiO2 in performing the spacer etchback protocol describe above, but rather can employ any suitable material. For example, if the mask is formed of a quartz substrate, than any suitable material whose properties are compatible with quartz can be employed by the present invention. Similarly, the invention can be employed to compensate for post fabrication errors on a chrome imprint mask.

It is to be appreciated that the monitor component 104 can be, for example, a scatterometry component. An advantage associated with employing a scatterometry system to monitor an imprint mask is that retrograde profiles on mask features can be detected without requiring cross-sectioning of the mask. The present invention contemplates any suitable scatterometry component and/or system, and such systems are intended to fall within the scope of the hereto-appended claims. It is further to be appreciated that the monitoring component 104 utilized by the present invention can be, for example, a Scanning Electron Microscope (SEM), a Critical Dimension Scanning Electron Microscope (CD-SEM), a Field Effect Scanning Electron Microscope (FESEM), an In-Lens FESEM, or a Semi-In-Lens FESEM, depending on the desired magnification and precision. For example, FESEM permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically 0.5 kV to 30 kV), it is able to do so without inducing extensive electrical charge in the sample. Furthermore, conventional SEM cannot accurately image an insulating material unless the material is first coated with an electrically conductive material. FESEM mitigates the need to deposit an electrically conductive coating prior to scanning. According to another example, the monitor component 104 of the present invention can be In-Lens FESEM, which is capable of 0.5 nm resolution at an accelerating voltage of 30 kV, or any other suitable type of scanner, such as Transmission Electron Microscopy (TEM), Atomic Force Microscopy (AFM), Scanning Probe Microscopy (SPM), etc.

Figure 2:
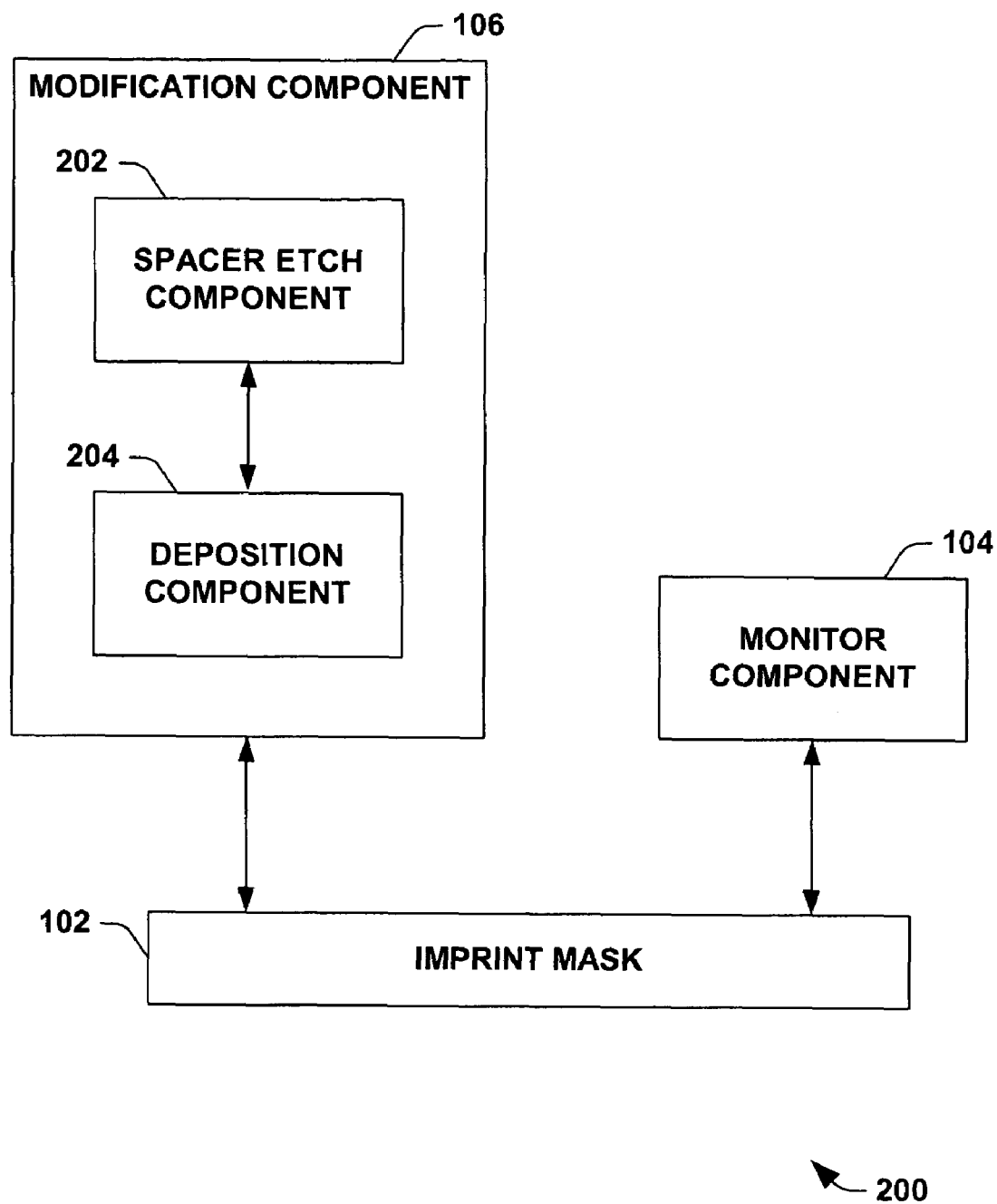
FIG. 2 is an illustration of a mask critical dimension modification system in accordance with an aspect of the present invention further comprising a spacer etch component and a deposition component.

Now turning to FIG. 2, a mask critical dimension modification system 200 utilizes a spacer etch component 202 and a deposition component 204 to facilitate the CD error correction of the imprint mask 102. When an error is detected by the monitor component 104 with the imprint mask, the deposition component 204 provides a selectively deposited layer of silicon (SiO2). It is appreciated that the deposition component 204 is not limited to use of silicon but rather any suitable material in conjunction with the imprint mask material. Upon completion of selectively depositing the suitable material layer, the spacer etch component 202 employs a spacer etchback technique used to control the profile and lateral lines of the imprint mask 102. The spacer etch component 202 can utilize an etching process to remove selected areas from the surface of the imprint mask.

In addition to correcting the imprint mask 102 of errors and/or defects, the spacer etch component 202 and the deposition component 204 provide smaller gaps on the imprint mask profile which ultimately lead to smaller lines in imprint lithography. For example, an imprint mask can be fabricated with a gap distance of X between two imprint mask features. The distance X could be a distance Y off of the expected gap Z. In other words, an imprint mask with a gap of X has error of distance Y because the imprint mask distance should be Z. Thus, the spacer etch component 202 and the deposition component 204 can employ the necessary modifications in order to correct the gap distance in the mask from X to Z. Such details will be discussed further below.

Figure 3:
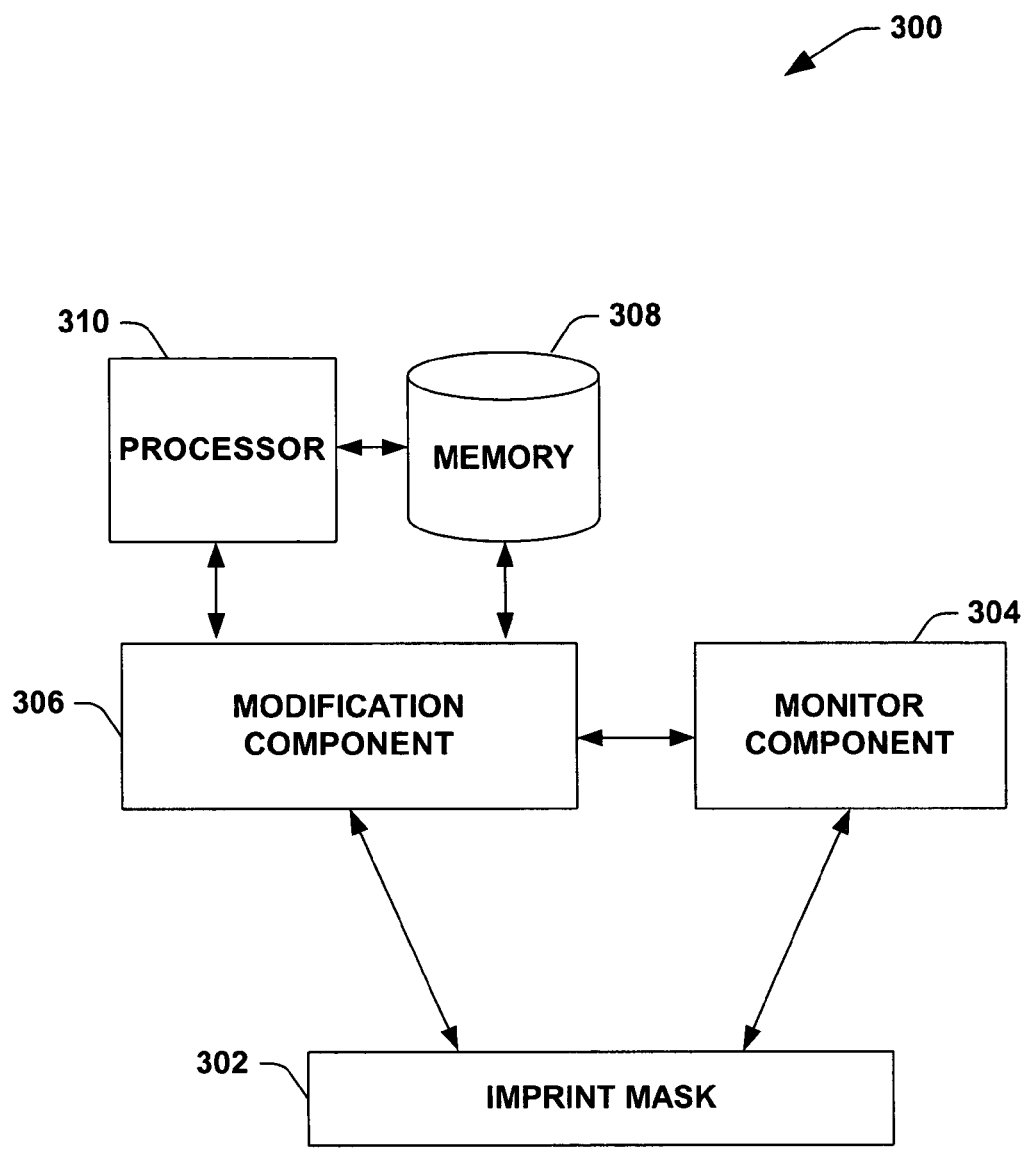
FIG. 3 is an illustration of a mask critical dimension modification system in accordance with an aspect of the present invention comprising a processor and a memory.

FIG. 3 is an illustration of a mask critical dimension modification system 300 facilitating the correction of CD error on an imprint mask. The modification component 306 is operatively associated with a processor 310 and a memory 308, both of which are operably coupled to each other. It is to be understood that a that the processor 310 can be a processor dedicated to determining whether CD errors exist on the imprint mask 302, a processor used to control one or more of the components of the present system(s), or, alternatively, a processor that is used to determine whether CD errors exist and to control one or more of the components of the mask CD modification system 300.

The memory component 308 can be employed to retain mask identification information, mask profile and lateral line dimensions, mask CD, semiconductor fabrication data, etc. Furthermore, the memory 308 can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 308 of the present systems and methods is intended to comprise, without being limited to, these and any other suitable types of memory.

Figure 4:
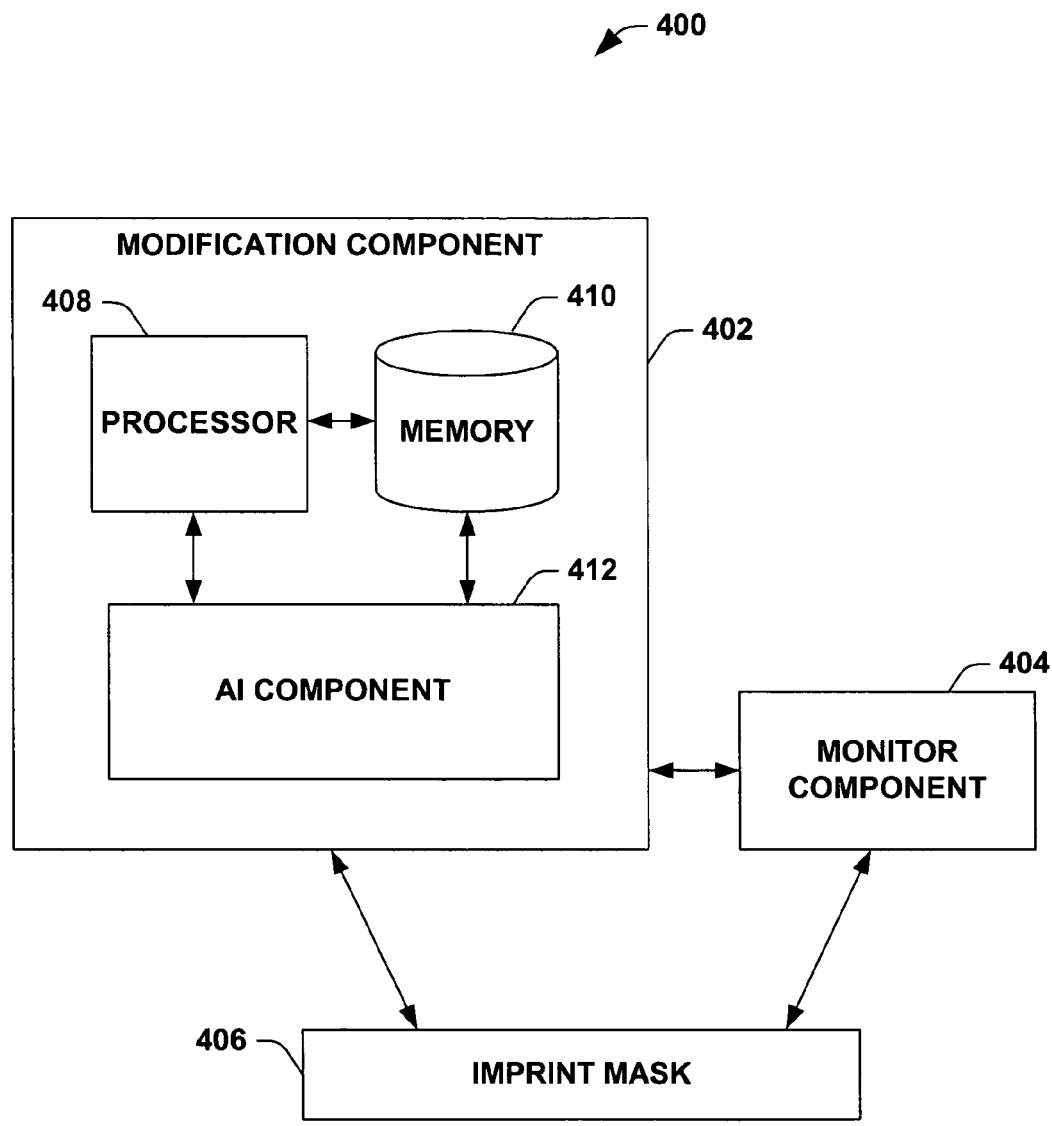
FIG. 4 is an illustration of a mask critical dimension modification system in accordance with the present invention wherein a modification component further comprises an artificial intelligence component

FIG. 4 is an illustration of a mask critical dimension modification system 400 in accordance with an aspect of the present invention. The mask critical dimension modification system 400 can employ various inference schemes and/or techniques in connection with mitigating post fabrication imprint mask errors. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 4, the mask critical dimension modification system 400 comprises a modification component 402 that is operatively coupled to a monitor component 404. The monitor component 404 monitors the status of an imprint mask 406 and transmits data associated therewith to the modification component 402. The modification component 402 comprises a processor 408 that can analyze data received from the monitor component 404, and a memory component 410 that can store information related to various aspects of the imprint mask 406. The modification component 402 also comprises an artificial intelligence (AI) component 412 that can make inferences regarding system operation, such as whether and/or to what extent compensatory action should be taken to mitigate the post fabrication errors on the imprint mask 406.

For example, the AI component 412 can determine an optimal duration for employing the spacer etchback technique, an optimal amount of $SiO_2$ to be deposited on an imprint mask exhibiting post fabrication errors, etc. According to another example, the AI component 412 can make inferences regarding whether a detected CD error will adversely affect a wafer based on, for instance, location, amount of error based on target imprint mask features, etc. These examples are given by way of illustration only and are not in any way intended to limit the scope of the present invention or the number of, or manner in which the AI component makes, inferences.

Figure 5:
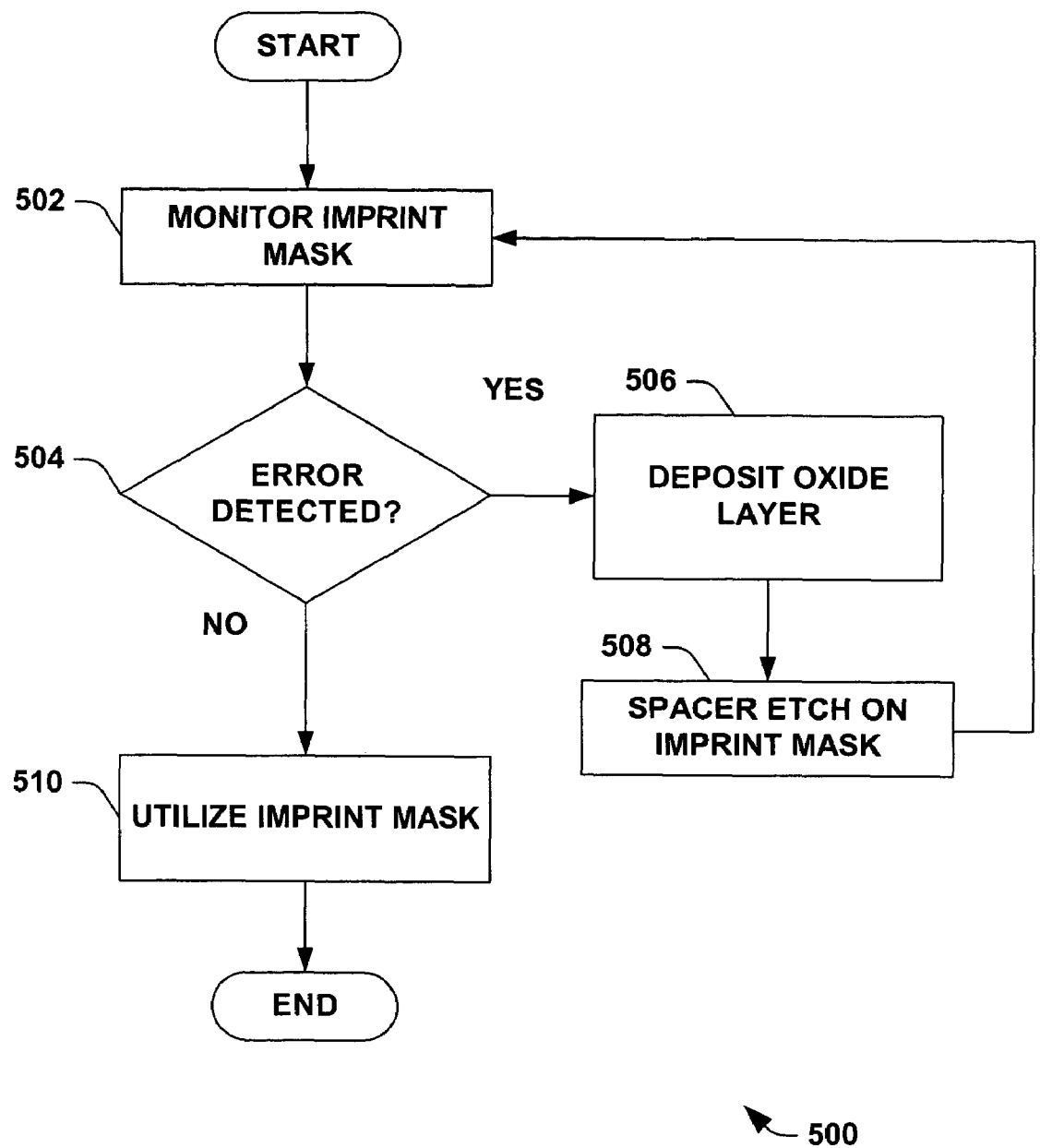
FIG. 5 is an illustration of a flow diagram of a methodology in accordance with an aspect of the present invention.
Figure 6:
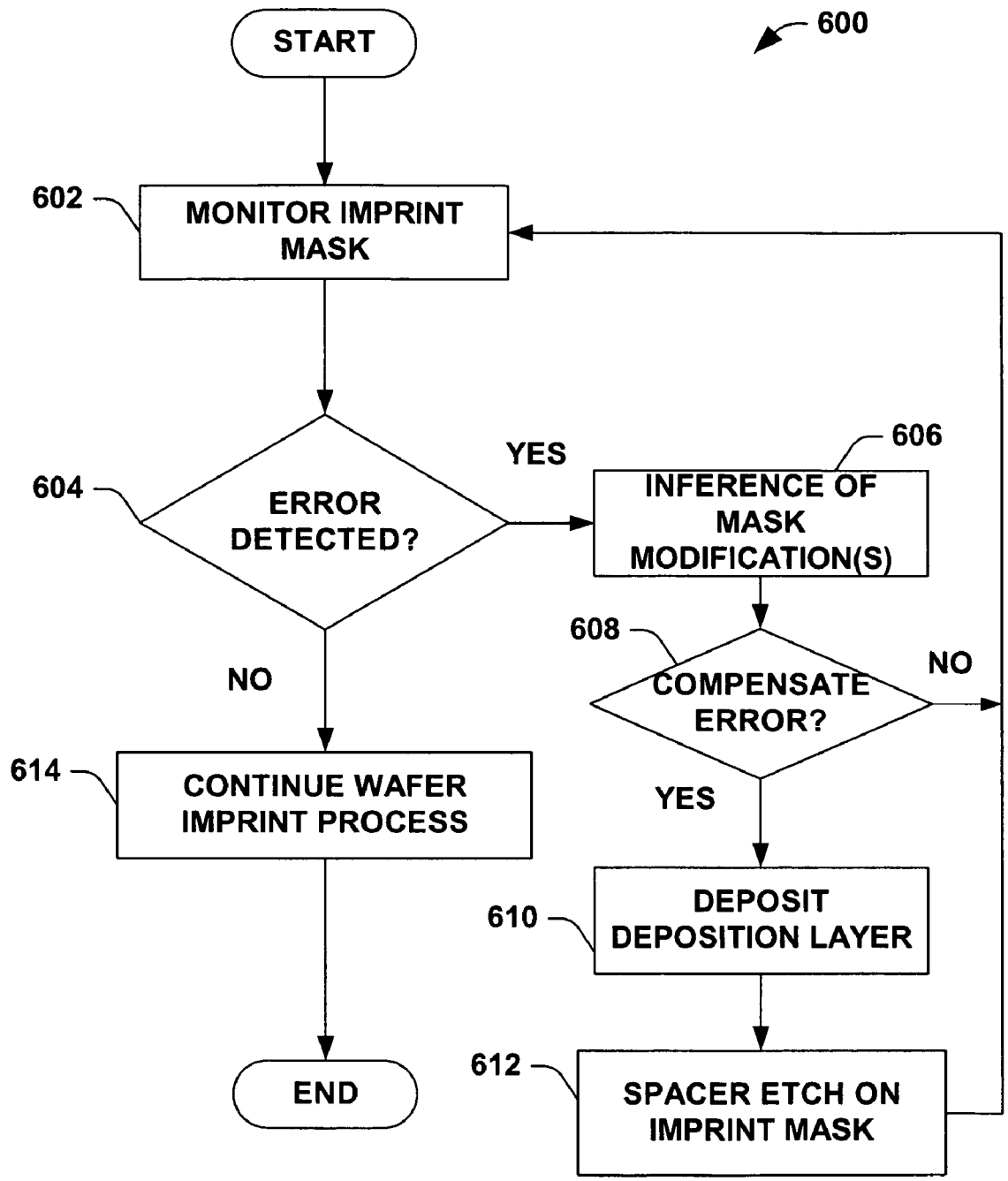
FIG. 6 is an illustration of a flow diagram of a methodology in accordance with an aspect of the present invention.

Now turning to FIGS. 5 and 6, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 5 is an illustration of a methodology 500 in accordance with an aspect of the present invention. At 502, an imprint mask is fabricated and monitored for any possible errors. The imprint mask is monitored via, for example, a scatterometry system. Scatterometry offers several advantages over other monitoring methods, including but not limited to, an ability to detect CD errors without requiring a cross-sectional image of an imprint mask. At 504, a determination is made whether or not an error is detected on the imprint mask. If it is determined at 504 that no errors are detected on the imprint mask, then the methodology can proceed to 510, where the imprint mask is further utilized. If errors are present on the imprint mask at 504, the methodology proceeds to 506, where a compensatory oxide layer can be deposited on the imprint mask. Silicon dioxide ($SiO_2$) is an exemplary material for a compensatory deposit layer as it is not affected by exposure during imprinting. However, any suitable material having properties consistent with those of the mask substrate (e.g., quartz, fused-silica, chrome, etc.) can be utilized, and the present invention contemplates any and all such materials.

Continuing at 508, a spacer etchback procedure is performed on the deposited compensatory layer, such that material is removed from the surfaces of the imprint mask, while deposited compensatory material is retained in areas created by the CD errors (e.g., achieved gap minus target gap areas). The methodology can then revert to 502 for further monitoring and imprint mask error detection to ensure that the compensatory measures were successful.

FIG. 6 is an illustration of a methodology 600 in accordance with an aspect of the present invention. An imprint mask is monitored via, for example, a scatterometry system, at 602. At 604, a determination is made as to whether, for example, CD errors are present on features of the imprint mask. If no errors are detected on the imprint mask at 604, then the imprint mask can be utilized to continue the wafer imprint process at 614. If imprint mask errors are detected at 604, then inferences can be made regarding whether to take corrective action at 606. At 608, a determination is made regarding whether to initiate compensatory action for the imprint mask error(s), based at least in part on inferences made at 606. For example, an imprint mask CD error may be detected such that it will not adversely affect a wafer imprinted by the defective mask. Inferences regarding, for example, the location of the imprint mask error, severity of the CD error, etc., can be utilized to determine whether the compensatory action is necessary. If it is determined that the particular detected imprint mask error will not be detrimental to the wafer upon imprinting, then the imprint mask can be employed to imprint a wafer at 614, thus saving any costs associated with compensating for the imprint mask CD error. If it is determined that the imprint mask requires compensatory action, then the methodology can proceed to 610, where a compensatory material can be deposited over the mask. The compensatory material can be, for example, silicon dioxide ($SiO_2$). Such material can then undergo a spacer etchback at 612. Once the spacer etchback is complete, the system can revert to 604 for further monitoring in order to verify that the compensatory action was successful. If so, then at 604, no error(s) will be detected and the imprint mask can be approved for use.

Figure 7:
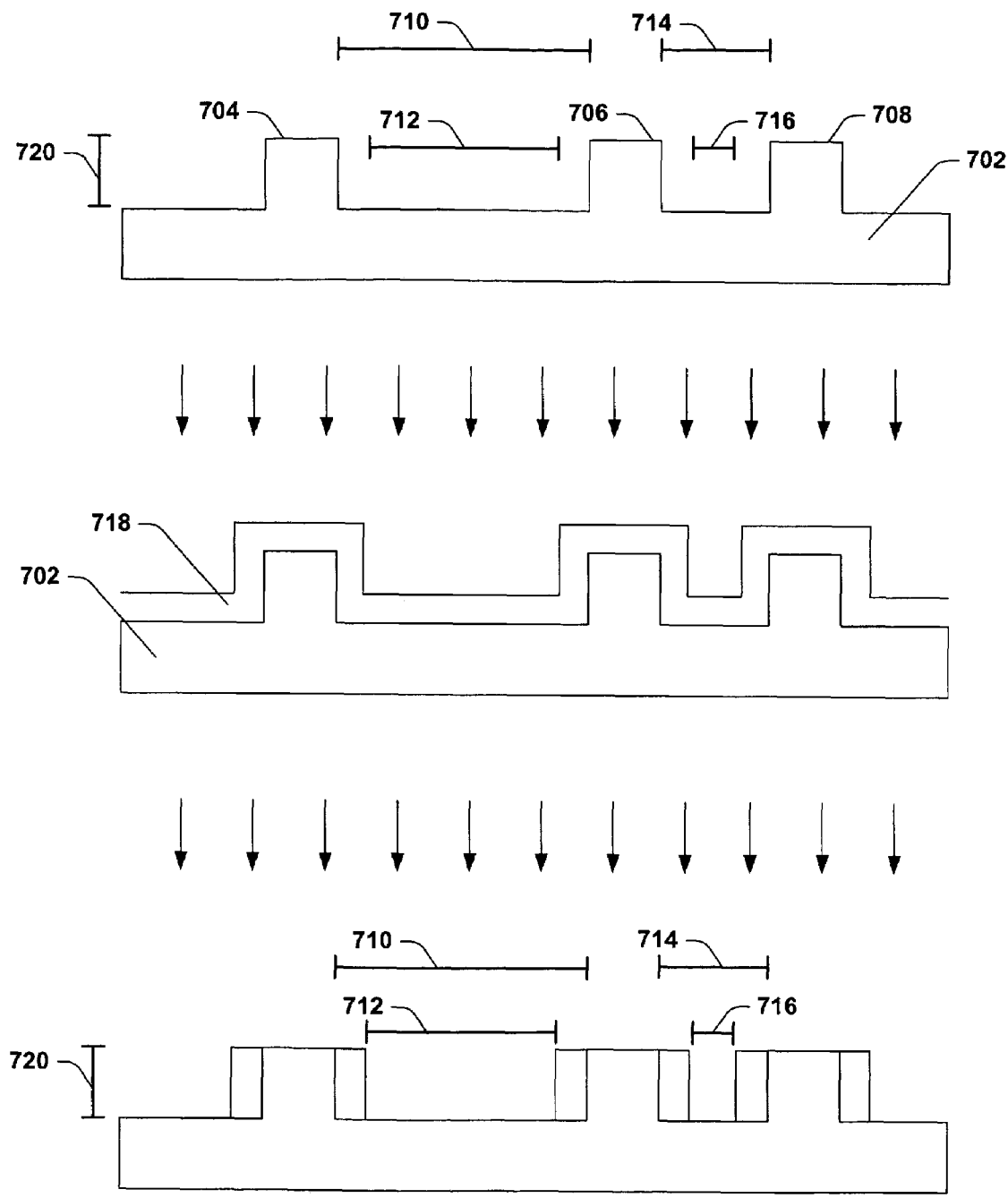
FIG. 7 illustrates a cross-sectional view of an imprint mask having critical dimension error undergoing a spacer etchback procedure to compensate for the critical dimension error.

FIG. 7 is a cross-sectional view 700 of a post fabrication imprint mask 702 having features 704, 706, and 708 that exhibit various profiles at a height 720. Furthermore, the imprint mask 702 contains errors in gap distance between the features. For example, an achieved gap distance 710 is shown between features 704 and 706 after fabrication of the imprint mask as well as a target gap distance 712. In other words, dealing with features 704 and 706, the achieved gap distance 710 minus the target gap distance 712 would yield the amount of error in the fabricated imprint mask based at least upon the particular features. Similarly, an achieved gap distance 714 between features 706 and 708 can have a target gap distance 716. Thus, the achieved gap distance 714 minus the target gap distance 716 will result in the amount of error between the features 706 and 708.

FIG. 7 further illustrates a cross-section 700 of a portion of an imprint mask 702 exhibiting imprint mask CD errors, which, as discussed above, can be detrimental to the structure of a wafer imprinted thereby. A spacer oxide 718 is deposited on the imprint mask 702, illustrated by a set of inverted arrows. The spacer oxide 718 occupies the space created by the error gap area and coats the surface of the mask 702. A spacer etch can be performed on the oxide layer 718, as indicated by the second set of inverted arrows, such that the spacer oxide 718 is etched away from the horizontal surfaces of the mask 702. Upon completion of the spacer etch, the gap distance between features 704, 706, and 708 has decreased yet, it is to be appreciated that the height 720 has not changed.

Still referring to FIG. 7, spacer etch provides the correction of the critical dimension error on the imprint mask 702. The achieved gap distance 710 is corrected by the selectively deposited and etched oxide layer such that the target gap distance 712 is reached. In other words, the error area (e.g., the achieved gap minus the target gap) is filled by oxide after the spacer etch. Likewise, the achieved gap distance 714 is corrected by etching the oxide until the achieved gap distance 714 is equal to the target gap distance 716. In addition to correcting errors on the post fabricated imprint mask 702, the present invention provides smaller gaps which ultimately lead to smaller line features used in imprint lithography.

Turning now to FIGS. 8-10, in accordance with one or more aspects of the present invention, a mask 802 (or one or more die located thereon) situated on a stage 804 can be logically partitioned into grid blocks to facilitate concurrent measurements of critical dimensions and overlay as the mask matriculates through a semiconductor fabrication process. This can facilitate selectively determining to what extent, if any, fabrication adjustments are necessary. Obtaining such information can also assist in determining problem areas associated with fabrication processes.

FIG. 8 illustrates a perspective view of the steppable stage 804 supporting the mask 802. The mask 802 can be divided into a grid pattern as shown in FIG. 8. Each grid block (XY) of the grid pattern corresponds to a particular portion of the mask 802 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess mask-to-mask and lot-to-lot variations. For example, a portion P (not shown) of a first mask (not shown) can be compared to the corresponding portion P (not shown) of a second mask. Thus, deviations between masks and lots can be determined in order to calculate adjustments to the fabrication components that are necessary to accommodate for the mask-to-mask and/or lot-to-lot variations.

In FIG. 9, one or more respective portions of the mask 802 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the mask 802 and or one or more die located thereon can be mapped into any suitable number and/or arrangement of grid blocks to effectuate desired monitoring and control.

FIG. 10 is a representative table of concurrently measured critical dimensions and overlay taken at various portions of the mask 802 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value ($V_A$) (e.g., no overlay error is indicated and/or overlay measurements and critical dimensions are within acceptable tolerances), while grid block $X_7Y_6$ has an undesired value ($V_U$) (e.g., overlay and critical dimensions are not within acceptable tolerances, thus at least an overlay or CD error exists). Thus, it has been determined that an undesirable fabrication condition exists at the portion of the mask 802 mapped by grid block $X_7Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire mask. It is to be appreciated that fabrication process parameters can be adapted so as to maintain, increase, decrease and/or qualitatively change the fabrication of the respective portions of the mask 802 as desired. For example, when the fabrication process has reached a pre-determined threshold level (e.g., X % of grid blocks have acceptable CDs and no overlay error exists), a fabrication step can be terminated.

Figure 11:
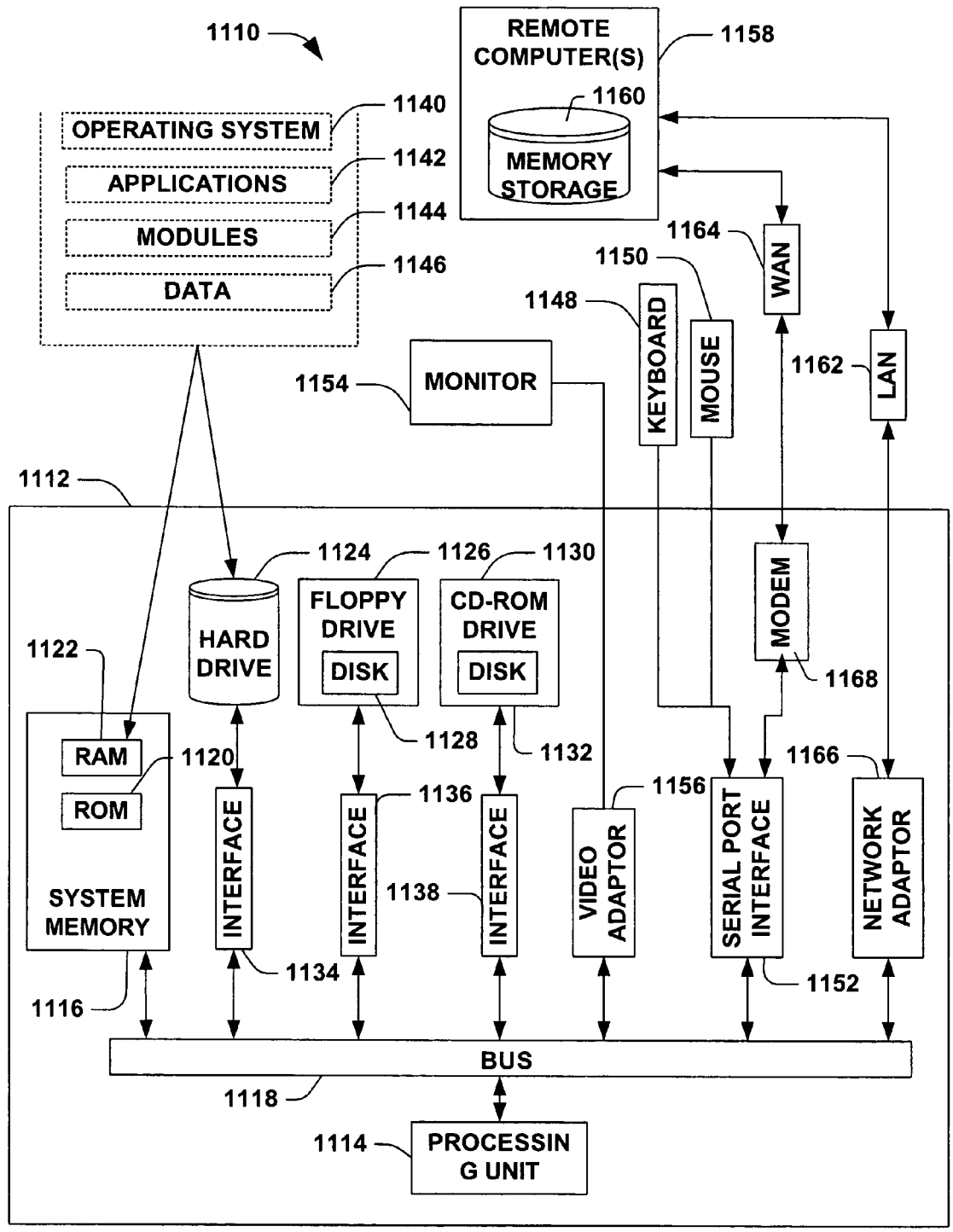
FIGS. 11 and 12 are illustrations of exemplary computing systems and/or environments in connection with facilitating employment of the subject invention.
Figure 12:
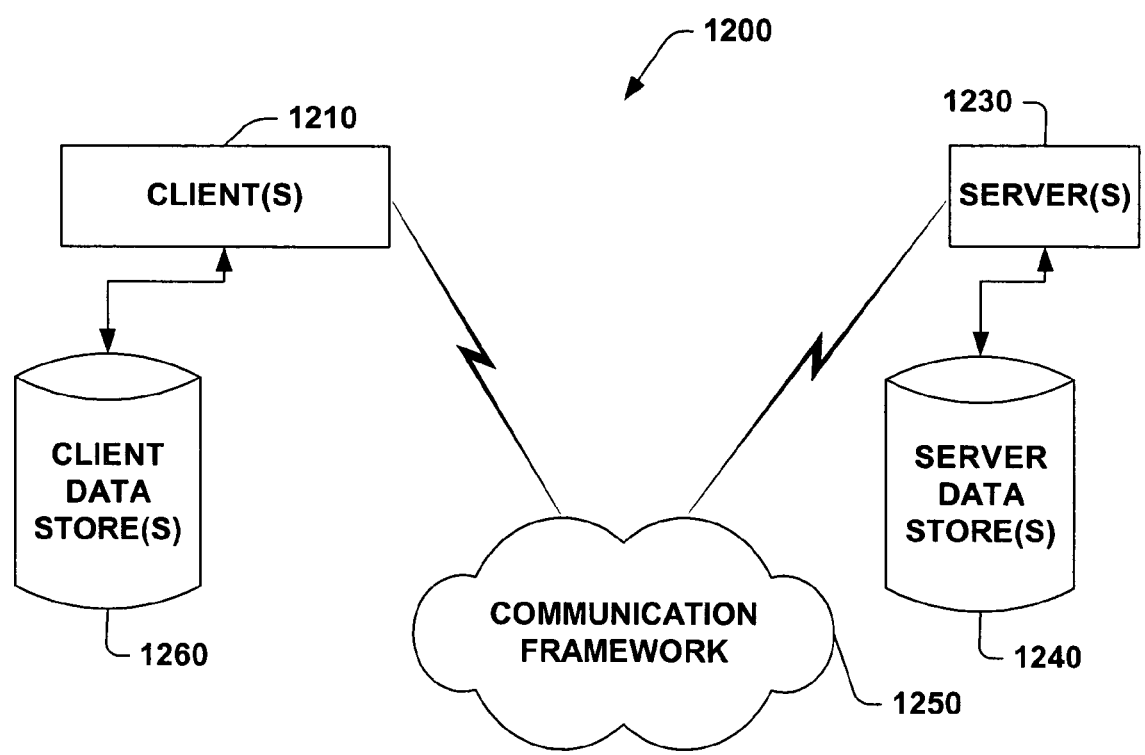

In order to provide a context for the various aspects of the invention, FIGS. 11 and 12 as well as the following discussion are intended to provide a brief, general description of a suitable computing environment in which the various aspects of the present invention can be implemented. While the invention has been described above in the general context of computer-executable instructions of a computer program that runs on a computer and/or computers, those skilled in the art will recognize that the invention also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention can also be practiced in distributed computing environments where tasks are performed by remote processing devices that are linked through a communications network. However, some, if not all, aspects of the invention can be practiced on stand-alone computers. In a distributed computing environment, program modules can be located in both local and remote memory storage devices.

With reference to FIG. 11, an exemplary environment 1110 for implementing various aspects of the invention includes a computer 1112. The computer 1112 includes a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114.

The system bus 1118 can be any of several types of bus structure(s) including the memory bus or memory controller, a peripheral bus or external bus, and/or a local bus utilizing any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1116 includes volatile memory 1120 and nonvolatile memory 1122. The basic input/output system (BIOS), comprising the basic routines to transfer information between elements within the computer 1112, such as during start-up, is stored in nonvolatile memory 1122. By way of illustration, and not limitation, nonvolatile memory 1122 can include read only memory (ROM), programmable ROM (PROM), electrically programmable ROM (EPROM), electrically erasable ROM (EEPROM), or flash memory. Volatile memory 1120 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1112 also includes removable/non-removable, volatile/non-volatile computer storage media. FIG. 11 illustrates, for example a disk storage 1124. Disk storage 1124 includes, but is not limited to, devices like a magnetic disk drive, floppy disk drive, tape drive, Jaz drive, Zip drive, LS-100 drive, flash memory card, or memory stick. In addition, disk storage 1124 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used such as interface 1126.

It is to be appreciated that FIG. 11 describes software that acts as an intermediary between users and the basic computer resources described in suitable operating environment 1110. Such software includes an operating system 1128. Operating system 1128, which can be stored on disk storage 1124, acts to control and allocate resources of the computer system 1112. System applications 1130 take advantage of the management of resources by operating system 1128 through program modules 1132 and program data 1134 stored either in system memory 1116 or on disk storage 1124. It is to be appreciated that the present invention can be implemented with various operating systems or combinations of operating systems.

A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment utilizing logical connections to one or more remote computers, such as remote computer(s) 1144. The remote computer(s) 1144 can be a personal computer, a server, a router, a network PC, a workstation, a microprocessor based appliance, a peer device or other common network node and the like, and typically includes many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses communication networks such as local-area networks (LAN) and wide-area networks (WAN). LAN technologies include Fiber Distributed Data Interface (FDDI), Copper Distributed Data Interface (CDDI), Ethernet/IEEE 1102.3, Token Ring/IEEE 1102.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1150 refers to the hardware/software employed to connect the network interface 1148 to the bus 1118. While communication connection 1150 is shown for illustrative clarity inside computer 1112, it can also be external to computer 1112. The hardware/software necessary for connection to the network interface 1148 includes, for exemplary purposes only, internal and external technologies such as, modems including regular telephone grade modems, cable modems and DSL modems, ISDN adapters, and Ethernet cards.

FIG. 12 is a schematic block diagram of a sample-computing environment 1200 with which the present invention can interact. The system 1200 includes one or more client(s) 1210. The client(s) 1210 can be hardware and/or software (e.g., threads, processes, computing devices). The system 1200 also includes one or more server(s) 1230. The server(s) 1230 can also be hardware and/or software (e.g., threads, processes, computing devices). The servers 1230 can house threads to perform transformations by employing the present invention, for example. One possible communication between a client 1210 and a server 1230 can be in the form of a data packet adapted to be transmitted between two or more computer processes. The system 1200 includes a communication framework 1250 that can be employed to facilitate communications between the client(s) 1210 and the server(s) 1230. The client(s) 1210 are operably connected to one or more client data store(s) 1260 that can be employed to store information local to the client(s) 1210. Similarly, the server(s) 1230 are operably connected to one or more server data store(s) 1240 that can be employed to store information local to the servers 1230.

What has been described above comprises examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "comprises" is used in either the detailed description or the claims, such term is intended to be inclusive in a manner similar to the term "comprising" as "comprising" is interpreted when employed as a transitional word in a claim.

What is claimed is:

1. A system for mitigating critical dimension errors on an imprint mask, comprising:
   a monitor component that detects errors on the imprint mask; and
   a modification component that at least one of selectively deposits and selectively etches a spacer oxide at an area of the errors on the imprint mask.

2. The system of claim 1, the monitor component comprises a scatterometry system.

3. The system of claim 1, the modification component comprises an artificial intelligence component that makes inferences regarding whether to mitigate critical dimension errors on the imprint mask.

4. The system of claim 3, the artificial intelligence component comprises at least one of a support vector machine, a neural network, an expert system, a Bayesian belief network, fuzzy logic, and a data fusion engine.

5. The system of claim 1, the modification component deposits and etches a spacer oxide if an achieved gap distance is not within a declared tolerance to a target gap distance between at least two features on the imprint mask.

6. The system of claim 1, the spacer oxide comprises silicon dioxide.

7. The system of claim 1, further comprising at least one sensor that gathers data associated with at least one parameter of a physical condition of the imprint mask.

8. A method for providing critical dimension error modification on an imprint mask, comprising:
monitoring an imprint mask for errors;
detecting an error on the imprint mask; and compensating for detected errors on the imprint mask;
depositing a spacer oxide layer on the imprint mask if an error is detected; and
selectively etching the spacer oxide from the imprint mask to mitigate detected critical dimension errors.

9. The method of claim 8, the monitoring employs a scatterometry system to detect critical dimension errors on the imprint mask.

10. The method of claim 8, further comprising making inferences regarding imprint mask status and storing the inferences in a memory.

11. The method of claim 10, further comprising employing inferences regarding imprint mask status to determine whether to initiate compensatory measures for detected critical dimension error.

12. The method of claim 8, further comprising generating feedback for controlling at least one parameter associated with at least one of monitoring the imprint mask and compensating for an imprint mask error.

13. The method of claim 8, further comprising grid-mapping the imprint mask to a plurality of sections.

14. The method of claim 13, further comprising creating a library of grid-map sections that are non-critical to facilitate a decision regarding initiating compensatory action to mitigate a detected imprint mask error.

15. A method for mitigating imprint mask critical dimension error, comprising:
means for monitoring an imprint mask in situ to detect imprint mask critical dimension errors;
means for selectively compensating in real time for critical dimension errors on the imprint mask; and
means for selectively compensating for imprint mask critical dimension error comprising means for providing a spacer etchback.

16. The method of claim 15, further comprising means for determining whether detected imprint mask critical dimension errors are sufficiently mitigated.

17. The method of claim 15, the means for monitoring further comprising means for sensing data associated with at least one physical parameter of the imprint mask.

18. The method of claim 15, further comprising means for generating feedback data for controlling at least one parameter associated the means for monitoring the imprint mask and the means for selectively compensating for imprint mask critical dimension error.

* * * * *